United States Patent
Matsubara (10) Patent No.: US 7,148,575 B2
(45) Date of Patent: Dec. 12, 2006

(54) SEMICONDUCTOR DEVICE HAVING BONDING PAD ABOVE LOW-K DIELECTRIC FILM

(75) Inventor: Yoshihisa Matsubara, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 65 days.

(21) Appl. No.: 11/009,074

(22) Filed: Dec. 13, 2004

(65) Prior Publication Data

US 2005/0173806 A1 Aug. 11, 2005

(30) Foreign Application Priority Data

Feb. 9, 2004 (JP) ............................. 2004-031877

(51) Int. Cl.
*H01L 29/40* (2006.01)
(52) U.S. Cl. .................. 257/774; 257/784; 257/758; 438/629; 438/617; 438/622
(58) Field of Classification Search ................ 257/203, 257/691, 758, 759, 760, 774, 776; 438/629, 438/627, 622
See application file for complete search history.

(56) References Cited

U.S. PATENT DOCUMENTS

| | | | |
|---|---|---|---|
| 6,143,396 A | 11/2000 | Saran et al. | |
| 6,163,075 A | 12/2000 | Okushima | |
| 6,560,862 B1 | 5/2003 | Chen et al. | |
| 6,650,010 B1* | 11/2003 | Davis et al. | ................ 257/700 |
| 6,670,710 B1 | 12/2003 | Matsunaga | |
| 6,781,238 B1 | 8/2004 | Nonaka | |
| 2003/0201484 A1* | 10/2003 | Ozawa | ....................... 257/306 |

FOREIGN PATENT DOCUMENTS

JP 08/236706 9/1996

* cited by examiner

*Primary Examiner*—Nathan J. Flynn
(74) *Attorney, Agent, or Firm*—Leydig, Voit & Mayer, Ltd.

(57) ABSTRACT

A semiconductor device comprises a protective element on a substrate; a low-k dielectric film opposite the protective element and having mechanical strength smaller than a silicon oxide film; a mesh wiring opposite the protective element and in the low-k dielectric film, the mesh wiring including power supply wirings and ground wirings arranged in a mesh, the mesh wiring being electrically connected to the protective element; a silicon oxide film on the mesh wiring and the low-k dielectric film; and a bonding pad on the silicon oxide film and opposite the mesh wiring.

7 Claims, 14 Drawing Sheets

SEMICONDUCTOR DEVICE HAVING BONDING PAD ABOVE LOW-K DIELECTRIC FILM

FIELD OF THE INVENTION

The present invention relates to a semiconductor device having a low-k dielectric film and a bonding pad with an improved structure, and a manufacturing method therefor.

DESCRIPTION OF THE BACKGROUND ART

In order to obtain a semiconductor device having a finer structure, a dual damascene method has been employed as a multilayer wiring technique. Further, in response to requests for miniaturization of a semiconductor device and for a high operating speed, a technique has been developed whereby a CVD film, which is formed by doping an oxide film with an organic group, or an inorganic or organic film, which is formed by coating, is employed to reduce the dielectric constant (k) of an interlayer insulating film, thereby reducing the transmission of an electric signal.

Figure 13:
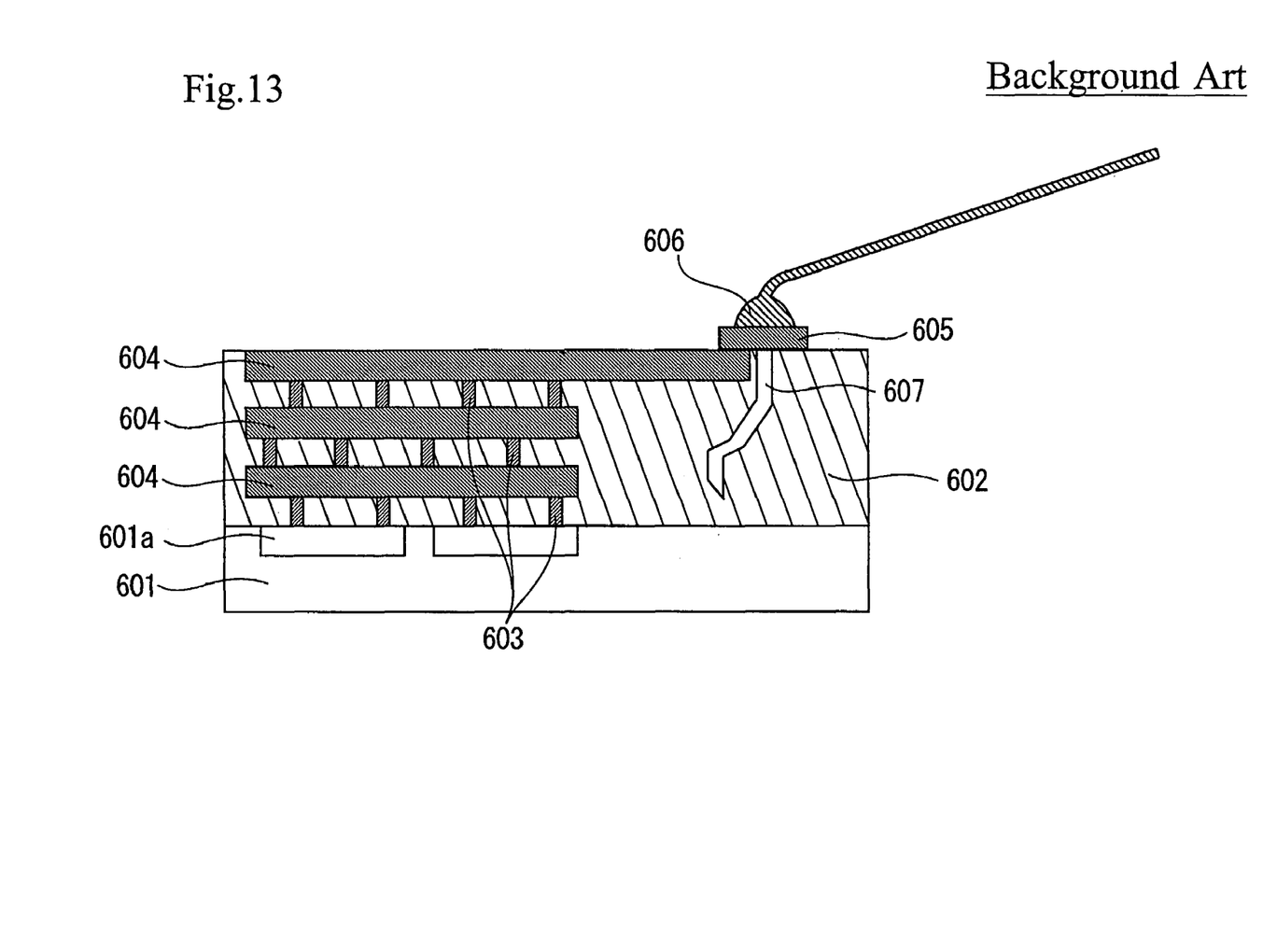
FIG. 13 is a cross-sectional view of a conventional semiconductor device having a low-k dielectric film.

FIG. 13 is a cross-sectional view of a conventional semiconductor device having a low-k dielectric film. In FIG. 13, a low-k dielectric film 602 is deposited on a substrate 601 having a diffusion layer 601a, and a multilayer wiring structure having a plurality of laminated wirings 604 and vias 603 are provided in the low-k dielectric film 602. A bonding pad 605 is formed at a predetermined location on the topmost wiring 604, and a wire 606 is connected to the bonding pad 605.

Figure 14:
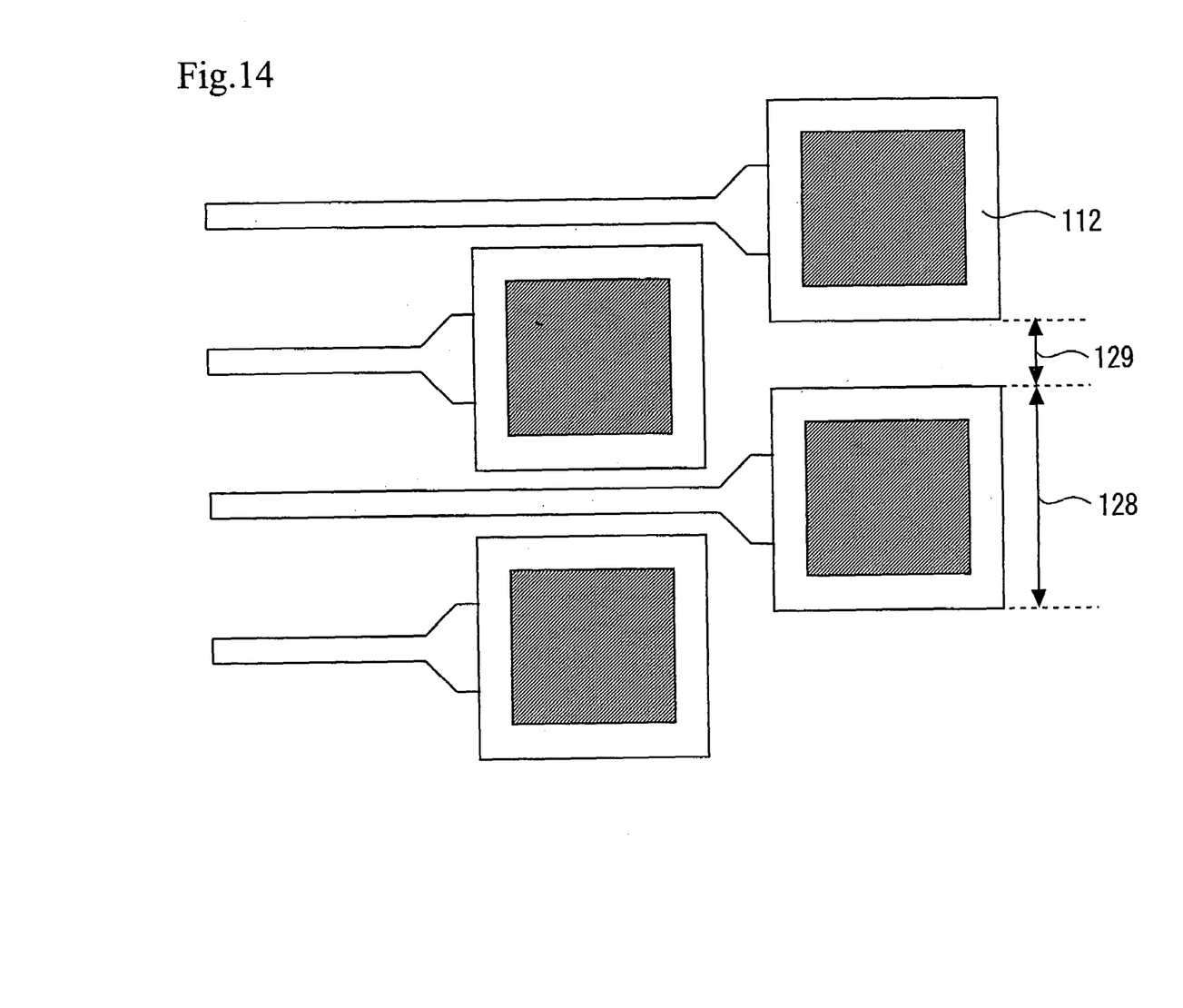
FIG. 14 is a plan view for explaining the intervals and the sizes of bonding pads.

The multi-functionality of a semiconductor device is accelerated as the low-k dielectric film 602 is introduced, and the number of bonding pads 605 used for the input/output of electric signals is increased. And as the ratio of the area occupied by the bonding pads 605 in the semiconductor device is increased, there is a corresponding accelerated reduction in the pitch and the size of the bonding pads 605. FIG. 14 is a plan view for explaining the intervals and the sizes of bonding pads. As shown in FIG. 14, a pad size 128 is reduced from a conventional 100 square μm or larger to 80 square μm or 60 square μm, and a currently obtained pad interval 129 is only about 5 μm, while conventionally it was 10 μm or longer. Therefore, the size of a pad pitch is reduced, and the joint area for the bonding pad and the wire is reduced.

According to an advanced semiconductor device that employs both a wire bonding technique for reducing pad pitch, and a low-k dielectric film for providing a finer structure and a higher operating speed, stress or impact occurred in wire bonding would be concentrated in the small bonding pads 605. Therefore, as shown in FIG. 13, a crack 607 may occur under the bonding pad 605, or the surface of the low-k dielectric film 602 may peel off the bonding pad 605 at the boundary between the low-k dielectric film 602 and the bonding pad 605. The cracking in the low-k dielectric film 602 or the peeling off of its surface would result not only in a bonding failure or an interruption in the transmission of electric signals, but would also, by adsorbing water, induce the corrosion of wiring and excessively deteriorate the reliability of the semiconductor device. Further, copper wiring 604, located under the bonding pad 605, would be exposed, and oxidization of the copper wiring 604 would occur. Thus, the characteristic of adhesion between the oxidized copper film and the bonding pad 605 would be reduced, and the wire bonding strength would be reduced.

In order to resolve these shortcomings, there has been proposed that laminated metallic films are used for bonding pads to increase both the resistance of an electrode portion and the interconnection of layers to resist the shocks that occur in wire bonding (see, for example, Japanese Patent Laid-Open Publication No. H11-340319). This method is effective when a bonding pad having a satisfactory size can be obtained. However, when this method is employed together with a pitch reduction technique that stress and shock are concentrated in a small area, the thin films used to form the bonding pad may peel off during bonding because of the laminated structure of such a bonding pad. Therefore, this method cannot cope with a reduction in the pad pitch, a currently desired improvement. And further, since the manufacturing method and the procedure management method are complicated, it is highly probable that stable mass production would be difficult.

Figure 15:
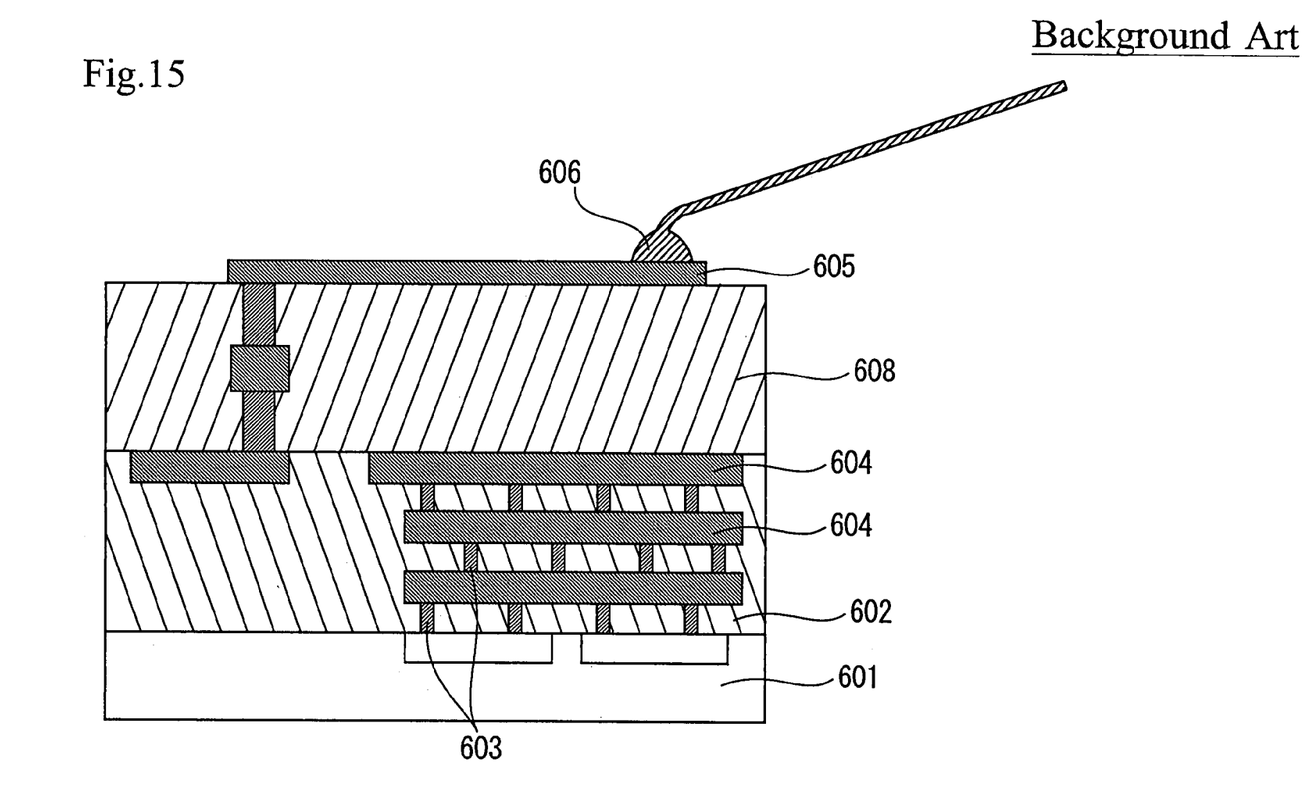
FIG. 15 is a cross-sectional view of a conventional semiconductor having reinforced wirings.

On the other hand, there has been proposed that a structure having a higher shock resistance than an interlayer insulating film material layer is placed under a bonding pad to reinforce layers underlying the bonding pad (see, for example, Japanese Patent Laid-Open Publication No. H11-54544). FIG. 15 is a cross-sectional view of a conventional semiconductor device having reinforced wirings.

However, the reinforced structure is independent from the signal wirings in the above-mentioned semiconductor device, and the reinforced wirings underlying the bonding pad are not acted as a device. Therefore, there are problems that a die size is enlarged by the size of the reinforced wirings and that the size of the semiconductor chip cannot be reduced.

SUMMARY OF THE INVENTION

The present invention has been conceived to solve the previously-mentioned problems and a general object of the present invention is to provide novel and useful semiconductor device and is to provide novel and useful method for manufacturing a semiconductor device.

One more specific object of the present invention is to provide a semiconductor device including a pad structure having a high mechanical strength. Another more specific object of the present invention is to provide a semiconductor device including a pad structure that permits the size of a semiconductor chip to be reduced.

The above object of the present invention is attained by a following semiconductor device and a following method for manufacturing a semiconductor device.

According to first aspect of the present invention, the semiconductor device comprises a protective element formed on a substrate; a low-k dielectric film formed above the protective element and having a mechanical strength smaller than a silicon oxide film; a mesh wiring formed above the protective element and in the low-k dielectric film, the mesh wiring including power supply wirings and ground wirings formed like a mesh, the mesh wiring being electrically connected to the protective element; a silicon oxide film formed on the mesh wiring and the low-k dielectric film; and a bonding pad formed on the silicon oxide film and above the mesh wiring.

According to second aspect of the present invention, the semiconductor device comprises a low-k dielectric film formed on a substrate and having a mechanical strength smaller than a silicon oxide film; a mesh wiring formed in the low-k dielectric film and including power supply wirings and ground wirings formed like a mesh, the power supply wirings constituting a protective element; a silicon oxide film formed on the mesh wiring and the low-k dielectric film; and a bonding pad formed on the silicon oxide film.

According to third aspect of the present invention, the method for manufacturing a semiconductor device, comprises: forming a protective element on a substrate; forming an interlayer insulating film so as to cover the protective element; forming a plurality of plugs in the interlayer insulating film; forming a low-k dielectric film on the interlayer insulating film and the plugs, the low-k dielectric film having a mechanical strength smaller than a silicon oxide film; forming a mesh wiring in the low-k dielectric film by using a damascene method so as to connect with the plugs, the mesh wiring including power supply wirings and ground wirings; forming a silicon oxide film on the mesh wiring and the low-k dielectric film; and forming a bonding pad on the silicon oxide film and above the mesh wiring.

Other objects and further features of the present invention will be apparent from the following detailed description when read in conjunction with the accompanying drawings.

DETAILED DESCRIPTION OF THE PREFERRED EMBODIMENTS

In the following, principles and embodiments of the present invention will be described with reference to the accompanying drawings. The members and steps that are common to some of the drawings are given the same reference numerals and redundant descriptions therefore may be omitted.

The main purpose of the present invention is that, for the I/O block of a semiconductor chip, a power mesh wiring structure for a protective element is also employed as a structure for reinforcing a low-k dielectric film. Generally, a decoupling capacitor element, a Pch driver, an Nch driver and an ESD (Electro-Static Discharge) protective diode are used as circuit elements (hereinafter referred to as protective elements) in the I/O block. Of these protective elements, the dimensions of the areas occupied by the capacitor element and the diode are large, and the dimensions of the areas occupied by the drivers are comparatively small. Therefore, in order to reduce the size of the I/O block, as will be described later, an effective alternative is for the power mesh wiring structure to be employed not only as reinforcement for a low-k dielectric film, but as a capacitor element and a diode.

First Embodiment

Figure 1:
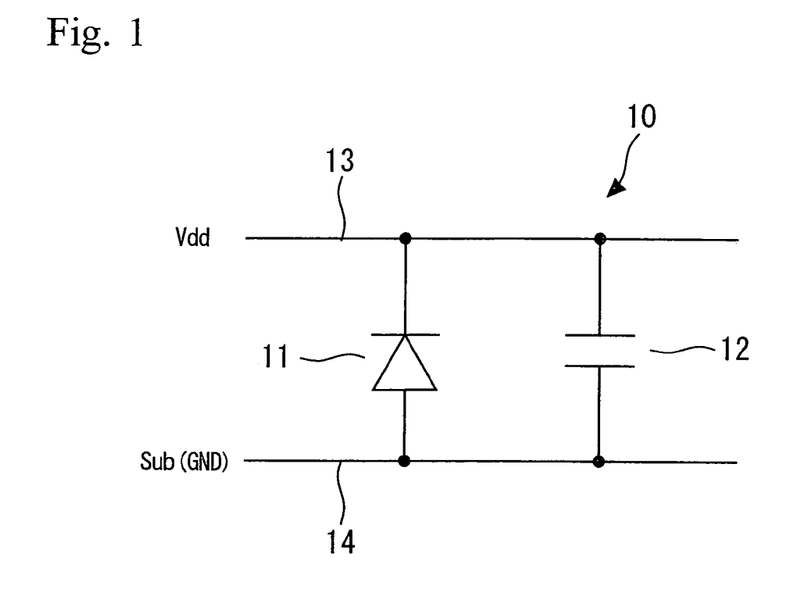
FIG. 1 is a circuit diagram showing a protective element according to a first embodiment of the present invention.

According to a first embodiment of the present invention, an explanation will be given for a case wherein a power mesh wiring structure for a protective element is also employed as a structure for reinforcing a low-k dielectric film. FIG. 1 is a circuit diagram showing a protective element according to a first embodiment of the present invention. As shown in FIG. 1, a protective element 10 in an I/O block includes a diode 11 and a capacitor element 12, both of which are connected via power supply wiring 13 to a terminal having a power voltage potential (Vdd) and are also connected via ground wiring 14 to a terminal having a ground potential (GND).

Figure 2:
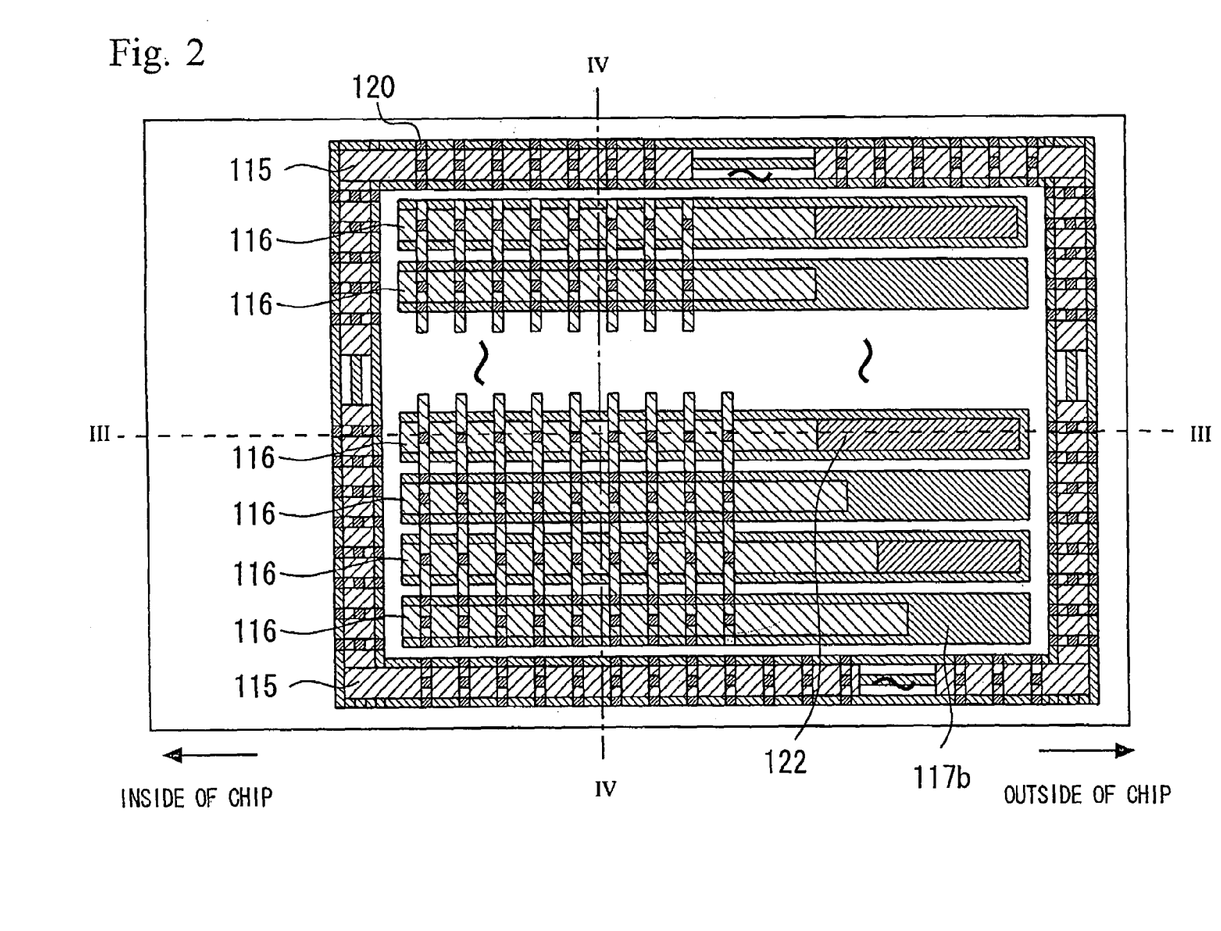
FIG. 2 is a plan view for explaining a semiconductor device according to the first embodiment of the present invention.
Figure 3:
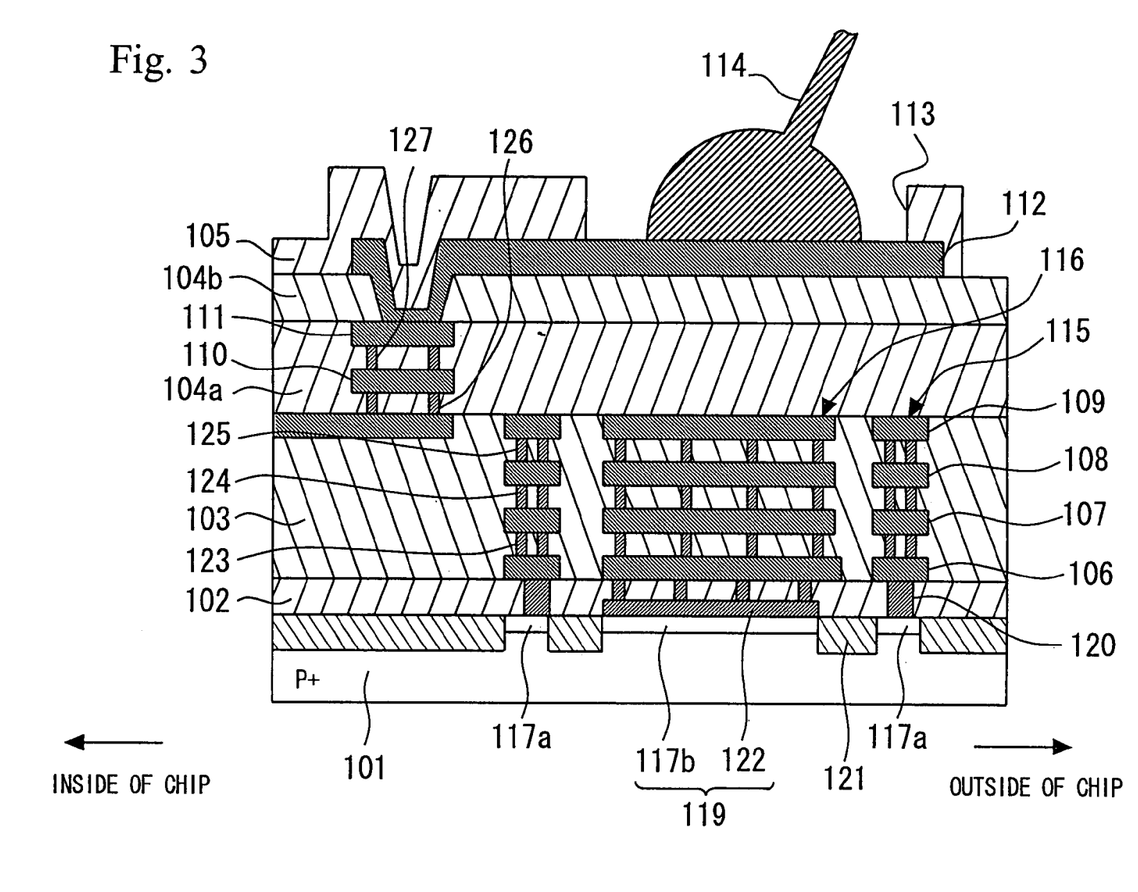
FIG. 3 is a cross-sectional view of the semiconductor device in FIG. 2 taken along line III—III.
Figure 4:
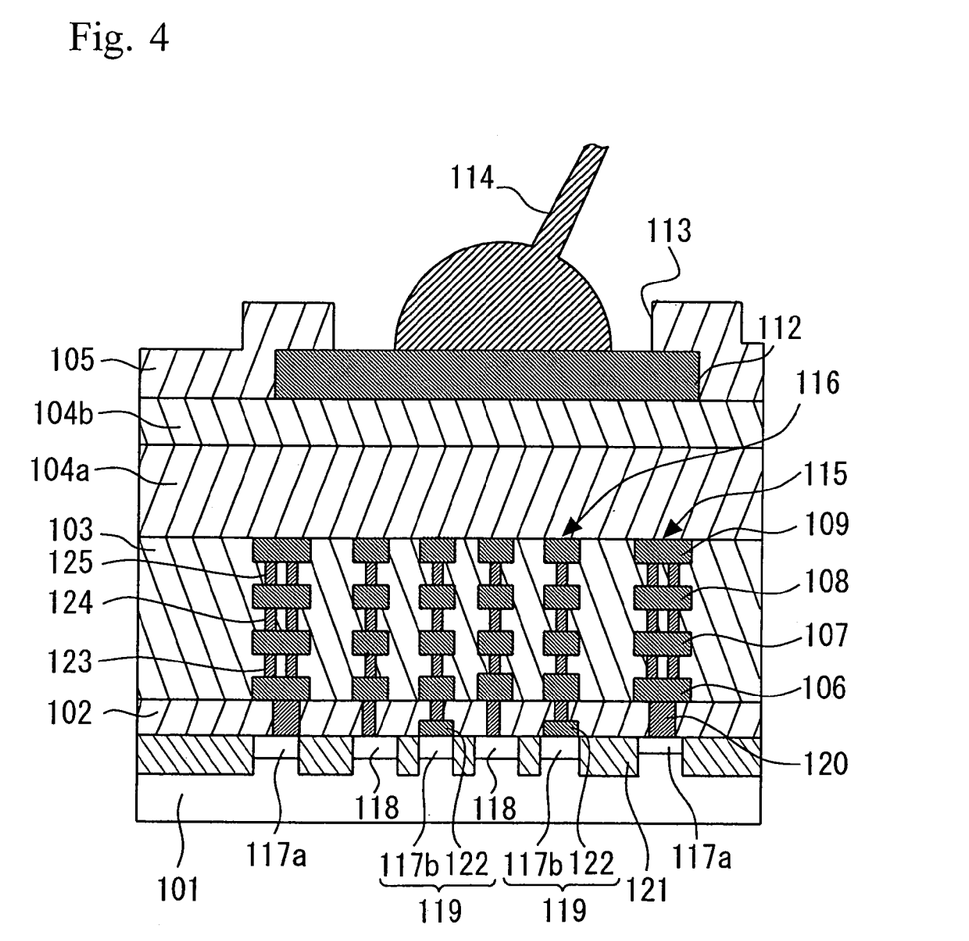
FIG. 4 is a cross-sectional view of the semiconductor device in FIG. 2 taken along line IV—IV.

FIG. 2 is a plan view for explaining a semiconductor device according to the first embodiment, FIG. 3 is a cross-sectional view of the semiconductor device in FIG. 2 taken along line III—III, and FIG. 4 is a cross-sectional view of the semiconductor device in F*ig*. 2 taken along line IV—IV.

As shown in FIGS. 2 to 4, a P$^+$ diffusion layer 117a for the prevention of latch-up, a P$^+$ diffusion layer 117b for a capacitor element 119, an N$^+$ diffusion layer 118 for a diode are formed in a P$^+$ silicon substrate serving as a substrate 101. These diffusion layers 117a, 117b and 118 are separated from each other by elements isolations 121 formed, for example, using the STI (Shallow Trench Isolation) method. The capacitor element 119 is constituted by the P$^+$ diffusion layer 117b and gate electrodes 122 made by polysilicon films formed on the P$^+$ diffusion layer 117b. A silicon oxide film, which is an interlayer insulating film 102, is formed on the substrate 101 to cover the diode 118 and the capacitor element 119. A plurality of plugs 120, formed in the silicon oxide film 102, connect the diode 118, or the capacitor element 119, to power supply wiring 116 and connect the diffusion layer 117a to ground wiring 115.

A low-k dielectric film 103 is formed on the silicon oxide film 102, and the low-k dielectric film 103 has a lower mechanical strength and hardness than that of the silicon oxide film 102. The low-k dielectric film 103 is a CVD film, or a coated film, having a relative dielectric constant of three or smaller, and is, specifically, a MSQ (Methyl Silsesquioxane) film, a HSQ (Hydrogen Silsesquioxane) film, an organic polymer film such as SiLK (trademark) by Dow Chemical Inc., or a film obtained by forming pores in one of these films (in actuality, the low-k dielectric film is a lamination composed of the cited films).

First wirings 106, second wirings 107, third wirings 108 and fourth wirings 109, the power supply wirings 116 and the ground wirings 115 are formed in the low-k dielectric film 103, and vias 123, 124 and 125 are provided to connect the power supply wirings 116 and the ground wirings 115 to the first to fourth wirings 106 to 109. That is, the power mesh wiring, which has the power supply wirings 116 and the ground wirings 115 formed as a mesh, is formed as the local wirings in the low-k dielectric film 103, which has a lower mechanical strength than the silicon oxide film 102. The power supply wirings 116 are formed in that portion of the low-k dielectric film 103 located above the diode 118 and the capacitor element 119. The power supply wirings 116 are connected, via the plugs 120, to the $N^+$ diffusion layer 118 and the gate electrodes 122. The ground wirings 115 are located outside the power supply wirings 116, i.e., located in the portion of the low-k dielectric film 103 formed above the $P^+$ diffusion layer 117a outside the diode 118 and the capacitor element 119. The ground wirings 115 are connected to the $P^+$ diffusion layer 117a via the plugs 120.

As shown in FIG. 2, the power supply wirings 116 and the ground wirings 115 are regularly positioned, with a specific wiring width, at specific wiring intervals. Further, according to the first embodiment, the power supply wirings 116 and the ground wirings 115 are positioned such that the wiring width therefor is twice or more that of the wiring interval. That is, the ratio (=wiring width/wiring interval) of the wiring width of the power supply wirings 116 to the wiring interval is two or greater, which will be described in detail later.

Two layers, i.e., silicon oxide films 104a and 104b, are formed on the power supply wirings 116, the ground wirings 115 and the low-k dielectric film 103. In the lower silicon oxide film 104a, fifth wirings 110 and sixth wirings 111 and vias 126 and 127, which connect the fifth and sixth wirings 110 and 111, are formed on the fourth wiring 109, which are signal lines inside a chip. That is, global wirings are formed in the silicon oxide film 104a. An opening is formed in the upper silicon oxide film 104b to expose the sixth wirings 111, and aluminum wiring, which is served as a bonding pad 112, is formed in the opening and on the silicon oxide film 104b. The bonding pad 112 is formed in thickness sufficient to absorb a shock that is caused by bonding a wire 114, and to relatively resist the effects of a probe test that is conducted for operation confirmation before the shipment of a product. It should be noted that, in accordance with the purpose of the usage, copper wiring could be employed as the bonding pad 112. The sixth wirings 111, the topmost layer, constitute the terminal for a signal line that is to be bonded. During a wafer test, a mechanical shock, such as that produced by the cutting performed by a probe needle, is applied to the bonding pad 112.

A silicon nitride film, which is served as a passivation film 105 used for preventing the entry of water, is formed on the silicon oxide film 104b and the aluminum wiring 112. An opening 113 is formed in the silicon nitride film 105, and the wire 114 is connected to the aluminum wiring 112, which is exposed at the bottom of the opening 113, to exchange an electrical signal with the outside. During the wire bonding, the substrate 101 is heated to a temperature of about 250° C. to 350° C., and ultrasonic vibrations and a load are imposed to the wire 114. The wire 114 is composed of a material such as gold, or an aluminum alloy.

A method for manufacturing the above described semiconductor device will now be described.

Figure 5A:
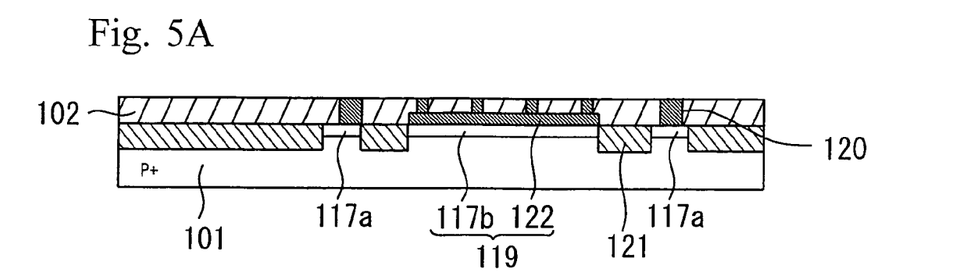
FIGS. 5A to 5C are processing cross-sectional views describing a method for manufacturing a semiconductor device according to the first embodiment of the present invention.
Figure 5B:
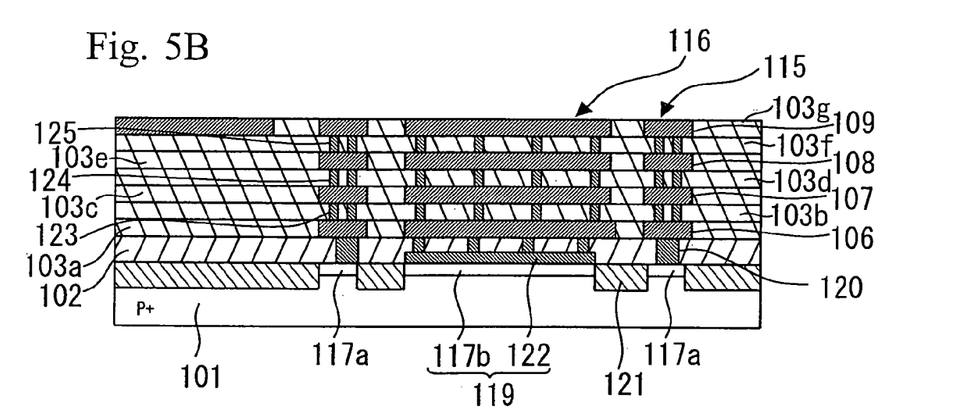
Figure 5C:
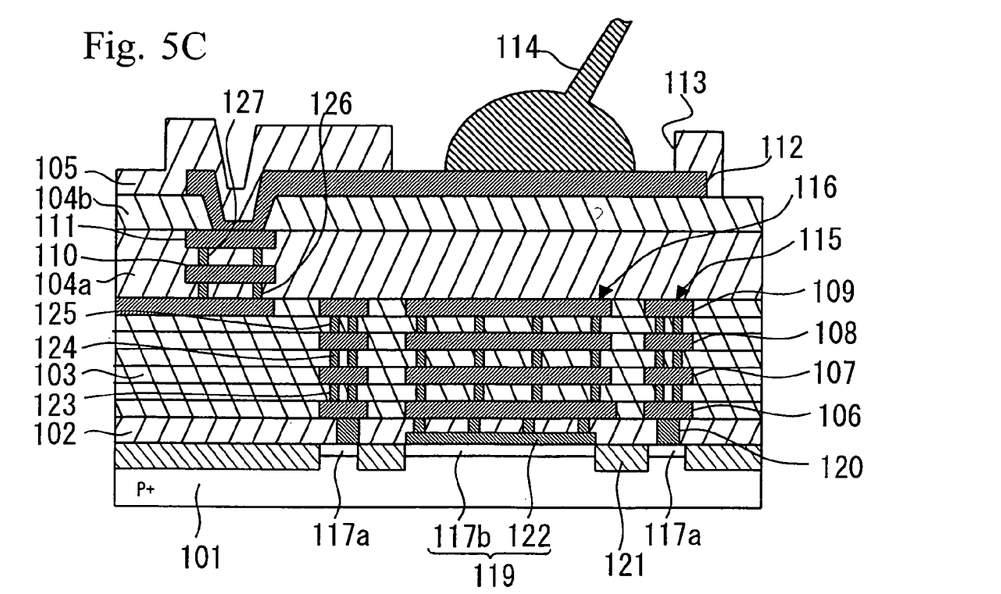

FIGS. 5A to 5C are processing cross-sectional views describing a method for manufacturing a semiconductor device according to the first embodiment of the present invention.

First, as shown in FIG. 5a, element isolations 121 are formed in a substrate 101 using the STI method. Next, diffusion layers 117a, 117b and 118 are formed in the substrate 101 by performing ion implantation and a thermal process. Then, a polysilicon film is formed and patterned to obtain, at a desired location, gate electrode 122. As a result, the diode 118 and the capacitor element 119 are formed.

Then, a silicon oxide film, which is served as an interlayer insulating film 102, is formed so as to cover the diode 118 and the capacitor element 119. Holes are formed in the silicon oxide film 102 using the lithography technique and dry etching. Thereafter, a conductive film, such as a tungsten film, is embedded in the holes to form a plurality of plugs 120.

Next, as shown in FIG. 5B, a low-k dielectric film 103a is formed on the plugs 120 and the silicon oxide film 102 using either the CVD method or the coating method. Then, trenches for the wirings 106 are formed in the low-k dielectric film 103a using the lithography method and dry etching. Sequentially, a conductive film is deposited and embedded in the trenches, and an unnecessary portion of the conductive film formed on the low-k dielectric film 103a is removed by the CMP method. In this manner, the wirings 106 are formed in the low-k dielectric film 103a.

Following this, a low-k dielectric film 103b is formed on the low-k dielectric film 103a and the wirings 106. In this case, the two low-k dielectric films 103a and 103b are of different types (this also applies for another low-k dielectric film that will be described later). Holes for the vias 123 are formed in the low-k dielectric film 103b using the lithography technique and dry etching. Thereafter, a conductive film is deposited and embedded in the holes, and an unnecessary portion of the conductive film formed on the low-k dielectric film 103b is removed by the CMP method. As a result, the vias 123 are formed in the low-k dielectric film 103b.

Hereinafter, using the same method, the wirings 107 are formed in a low-k dielectric film 103c, the vias 124 are formed in a low-k dielectric film 103d, the wirings 108 are formed in a low-k dielectric film 103e, the vias 125 are formed in a low-k dielectric film 103f, and the wirings 109 are formed in a low-k dielectric film 103g.

In this manner, by using a single damascene method, the power supply wirings 116 and the ground wirings 115 are formed in the low-k dielectric film 103 (103a to 103g).

Figure 6:
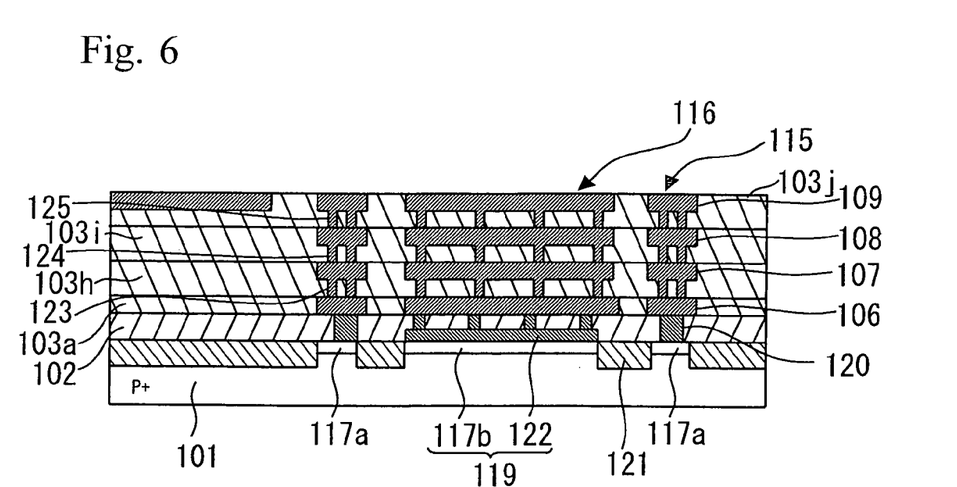
FIG. 6 is a cross-sectional view showing the processing employed to form mesh wiring using the dual damascene method.

Instead of the above-described single damascene method, the dual damascene method can be employed to form mesh wiring. FIG. 6 is a cross-sectional view showing the processing employed to form mesh wiring using the dual damascene method.

After the wirings 116 have been formed in the low-k dielectric film 103a using the above described method, as shown in FIG. 6, a low-k dielectric film 103h is formed on the entire substrate 101. Then, trenches for the wirings 107 are formed in the low-k dielectric film 103h, and in addition, holes for the vias 123 are formed. Thereafter, a conductive film is deposited and embedded in the trenches and the holes, and the CMP method is used to remove an unnecessary portion of the conductive film from the low-k dielectric film 103h by the CMP method. As a result, the vias 123 and the wirings 107 are formed inside the low-k dielectric film 103h.

By using the same method, a low-k dielectric film 103i is formed on the low-k dielectric film 103h and the wirings 107, and the vias 124 and the wirings 108 are formed in the low-k dielectric film 103i. In addition, a low-k dielectric film 103j is formed on the low-k dielectric film 103i and the wirings 108, and the vias 125 and the wirings 109 are formed in the low-k dielectric film 103*j*. In this manner, the power supply wirings 116 and the ground wirings 115 are formed in the low-k dielectric film 103 (103*a*, 103*h* and 103*i*).

Next, as shown in FIG. 5C, the wirings 110 and 111 and the vias 126 and 127 are formed in the silicon oxide film 104*a* using the single damascene method or the dual damascene method described above. Then, the silicon oxide film 104*b* is deposited on the silicon oxide film 104*a*, and an opening is formed in the silicon oxide film 104*b* to expose the wiring 111. An aluminum film is formed on the inner wall of the opening and on the silicon oxide film 104*b*, and the aluminum film is patterned. As a result, aluminum wiring served as the bonding pad 112 is obtained. Thereafter, a silicon nitride film served as a passivation film 105 is formed on the silicon oxide film 104*b* and the aluminum wiring 112 using the CVD method. Then, using the lithography technique and dry etching, the opening 113 is formed in the silicon nitride film 105 to expose the aluminum wiring 112.

Finally, while the substrate 101 is being heated, ultrasonic vibrations and a load are imposed on the wire 114 to connect it to the aluminum wiring 112.

As is described above, according to the first embodiment, the power supply wiring 116, which is connected via the plugs 120 to the diode 118 and the capacitor element 119, is also employed as the structure for reinforcing the low-k dielectric film 103. Furthermore, the ground wiring 115, which is connected via the plugs 120 to the diffusion layer 117*a* used for the prevention of latch-up, is also employed as the structure for reinforcing the low-k dielectric film 103. That is, the power mesh structure is also employed as the structure for reinforcing the low-k dielectric film 103. With this arrangement, the mechanical strength of the low-k dielectric film 103, formed beneath the bonding pad 112, can be increased, and in an I/O block, the wirings for reinforcing the low-k dielectric film 103 can be effectively employed as wiring for a protective element.

Figure 7A:
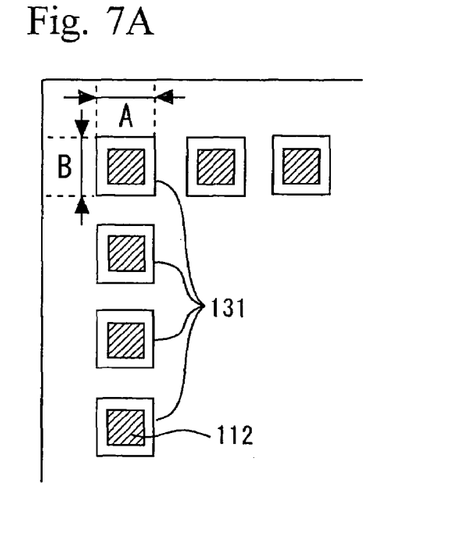
FIGS. 7A and 7B are plan views of the arrangement used for bonding pads in a semiconductor device.
Figure 7B:
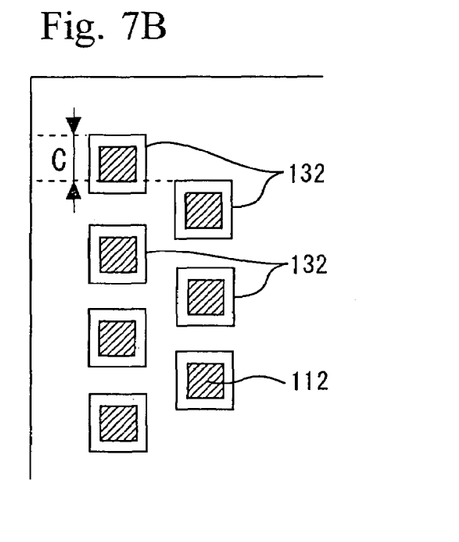
Figure 8:
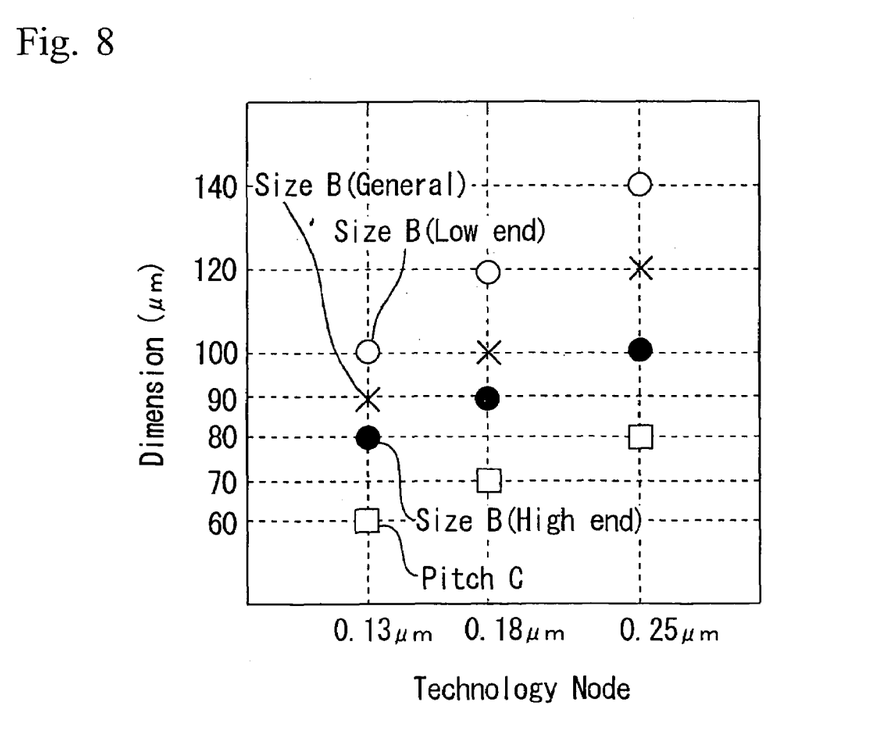
FIG. 8 is a diagram showing the relationship between a technology node and the size of a bonding pad.

FIGS. 7A and 7B are plan views of the arrangement used for bonding pads in a semiconductor device. In FIG. 7A, bonding pads 131 are arranged along a line, and in FIG. 7B, bonding pads 132 are arranged in the staggered manner. FIG. 8 is a diagram showing the relationship between a technology node and the size of a bonding pad.

As shown in FIG. 8, the size (length) B of each bonding pad arranged along a single line and the pitch C of bonding pads arranged in a zigzag fashion are reduced as the technology node becomes high. The size B ranges in size from the size B (High end) for a high end product (having a high added value) to the size B (Low end) for a low end product (having a low added value), with the size B (General) for a common product is located in the center. When the size B is reduced, the size A may be increased to obtain a contact dimension. The pitch C is a value smaller than the size B.

Therefore, mesh wiring, which is also used as a reinforcement structure, is placed beneath the bonding pads having the above-described sizes, and is connected to the semiconductor element. Thus, a semiconductor element having a function can be placed beneath the bonding pad. Therefore, design margin of a semiconductor device can be improved by the size of the bonding pad. Further, when a device that used to be at a different location is moved below the bonding pad, the size of the semiconductor chip can be reduced, and accordingly, the manufacturing cost for the semiconductor device can also be reduced. Furthermore, as the size of the semiconductor chip is reduced, an electrical communication device, such as a portable communication device on which the chip is mounted, can also be compactly made.

Figure 9:
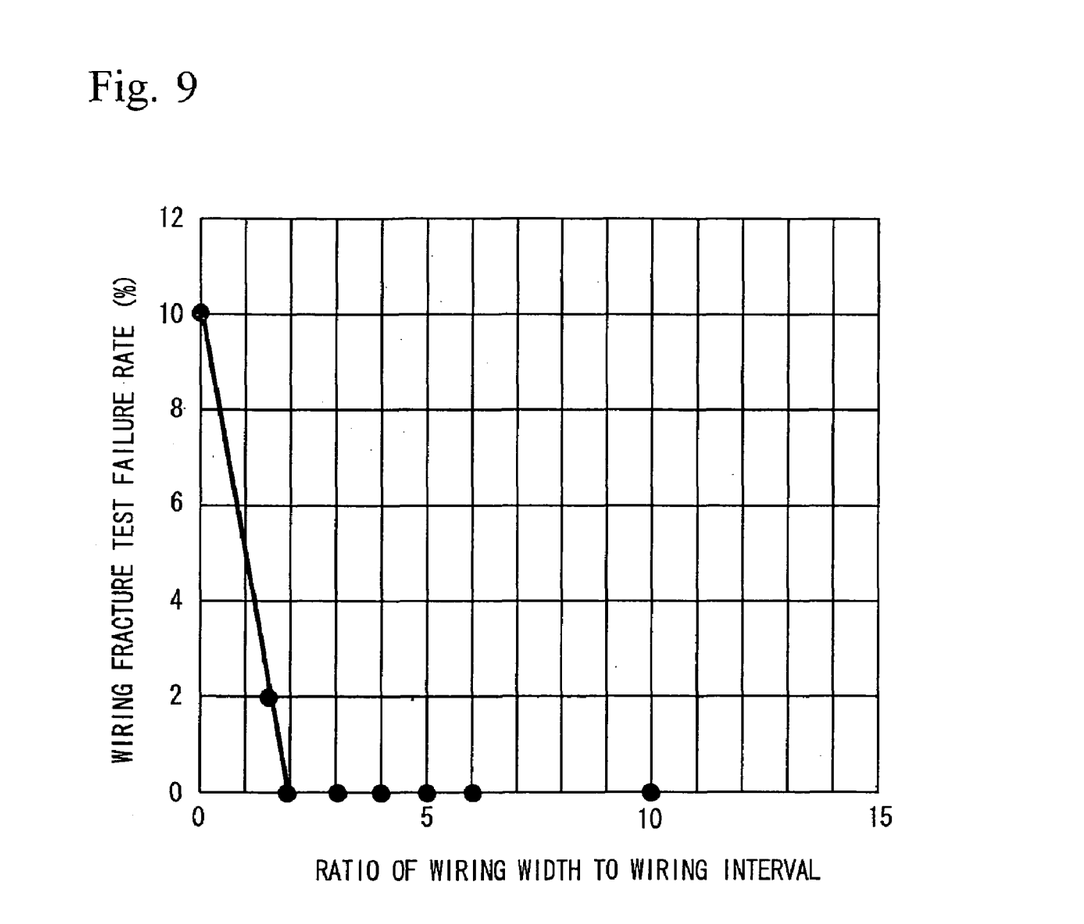
FIG. 9 is a graph showing the dependency of the yield of the wire fracture test results relative to the power supply wiring width/interval ratio in the first embodiment.

Further, as is described above, it is preferable that the ratio of the wiring width of the power supply wiring 116 to the wiring interval (hereinafter referred to as a "power supply wiring width/interval ratio") be two or greater, and it is further preferable that the maximum wiring width and the minimum wiring interval permitted by the design standards be employed. For example, the wiring width can be 0.2 to 3 μm, and the wiring interval can be 0.1 to 1.5 μm. FIG. 9 is a graph showing the dependency of the yield of the wire fracture test results relative to the power supply wiring width/interval ratio in the first embodiment. As shown in FIG. 9, when the power supply wiring width/interval ratio is two or greater, the failure rate is zero, and it is understood that a semiconductor device with a pad structure having a superior bonding strength (mechanical strength) can be provided. Further, the present inventor has confirmed that, when the wiring width/interval ratio for the ground wirings 115 and the power supply wirings 116 are set the above-described appropriate range, not only for the ground wirings 115, a superior bonding strength can be obtained, and a potential drop at the power supply portion can be prevented.

When the Cu damascene wiring is employed as the power supply wiring 116 and the ground wiring 115, the maximum wiring width need only be set to 3 μm and the wiring interval need only be about 1 μm, so that wiring erosion occurring at Cu-CMP can be reduced. As a result, the reliability of the semiconductor device can be further improved.

For the first embodiment, the silicon oxide film is employed as the interlayer insulating film 102. However, a low-k dielectric film may be employed instead of the silicon oxide film 102. In this case, a high bonding strength can also be obtained by using plugs formed in the interlayer insulating film 102 (this also applies to a second embodiment, which will be described later).

The present invention can also be applied for a case wherein instead of the diode 118 and the capacitor element 119, a MIS transistor in an I/O block is employed as a protective element. That is, the power supply wiring for the MIS transistor can also be employed as the structure for reinforcing the low-k dielectric film.

Second Embodiment

While the semiconductor device for an assembly using wire bonding has been explained in the first embodiment, a semiconductor device for a flip-chip assembly, in accordance with a second embodiment, will now be described. Mainly, the difference between this and the first embodiment will be explained.

Figure 10:
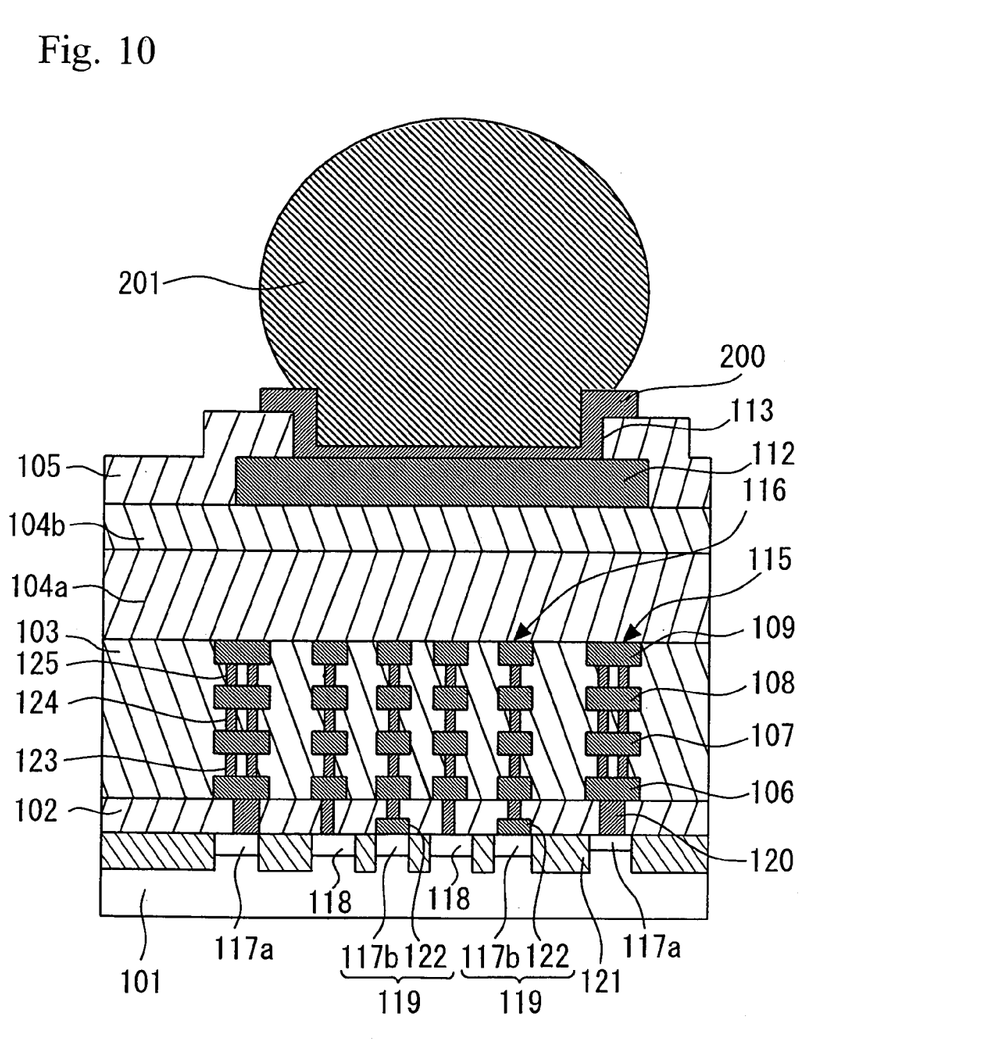
FIG. 10 is a cross-sectional view for explaining the semiconductor device according to a second embodiment of the present invention.

FIG. 10 is a cross-sectional view for explaining the semiconductor device according to a second embodiment of the present invention.

As shown in FIG. 10, power supply wirings 116 are formed in the portions of a low-k dielectric film 103 above a diode 118 and a capacitor element 119, and ground wirings 115 are formed in the portions of the low-k dielectric film 103 above a diffusion layer 117*a* for the prevention of latch-up. The power supply wirings 116 and the ground wirings 115 for protective elements are also used as a structure for reinforcing the low-k dielectric film 103. Two silicon oxide films 114*a* and 114*b* are formed on the power supply wirings 116 and the ground wirings 115. A bonding pad 112 is formed on the upper silicon oxide film 114*b*. A passivation film 105 is deposited on the bonding pad 112, and the pad 112 is exposed at the bottom of an opening 113 that is formed in the passivation film 105. An electrode 200 is provided in the opening 113 and on the passivation film 105, and a bump, which is a flip element 201, is formed on the electrode 200. The remainder of the structure is the same as that for the first embodiment.

The mechanical strength required for assembling is higher for the wire bonding structure than for the flip-chip structure. Therefore, it is clear that when the wire bonding structure explained in the first embodiment is changed to the flip-chip structure in the second embodiment, all the effects attained by the invention can also be obtained. Therefore, in the second embodiment, the effects described in the first embodiment can also be acquired.

Third Embodiment

For a third embodiment, an explanation will be given for a case wherein a metallic capacitor element is employed as a protective element.

Figure 11:
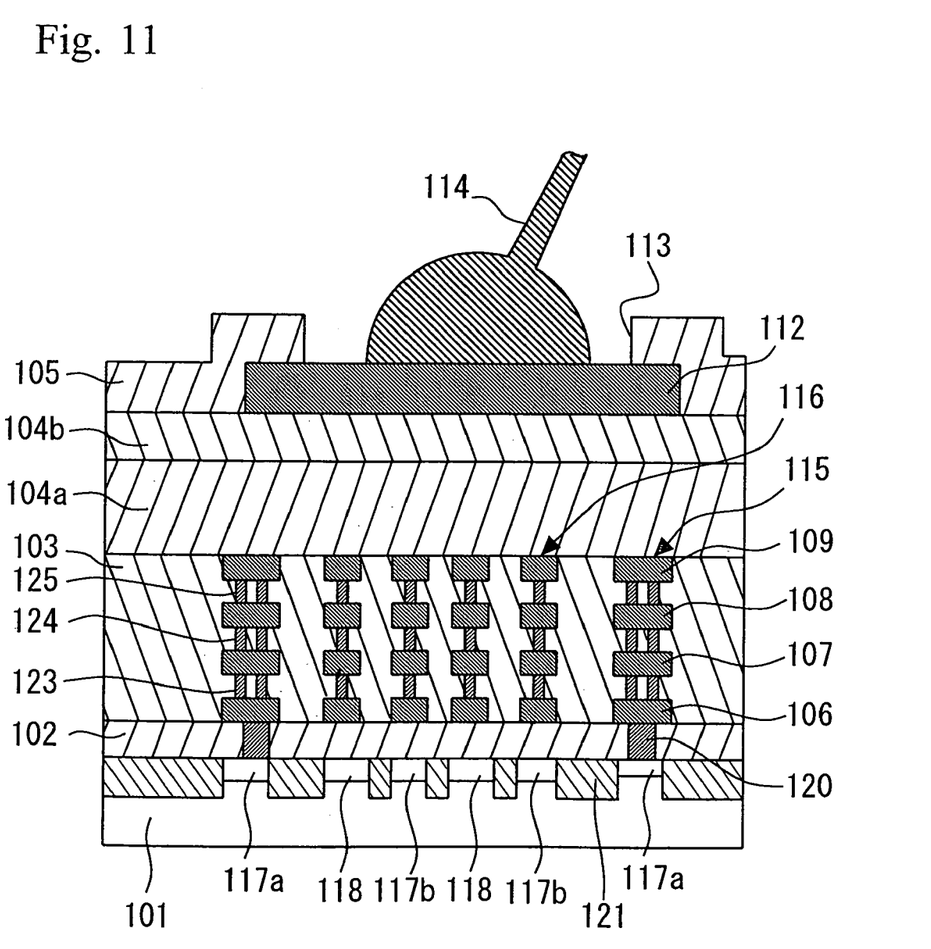
FIG. 11 is a cross-sectional view for explaining a semiconductor device according to a third embodiment of the present invention.
Figure 12:
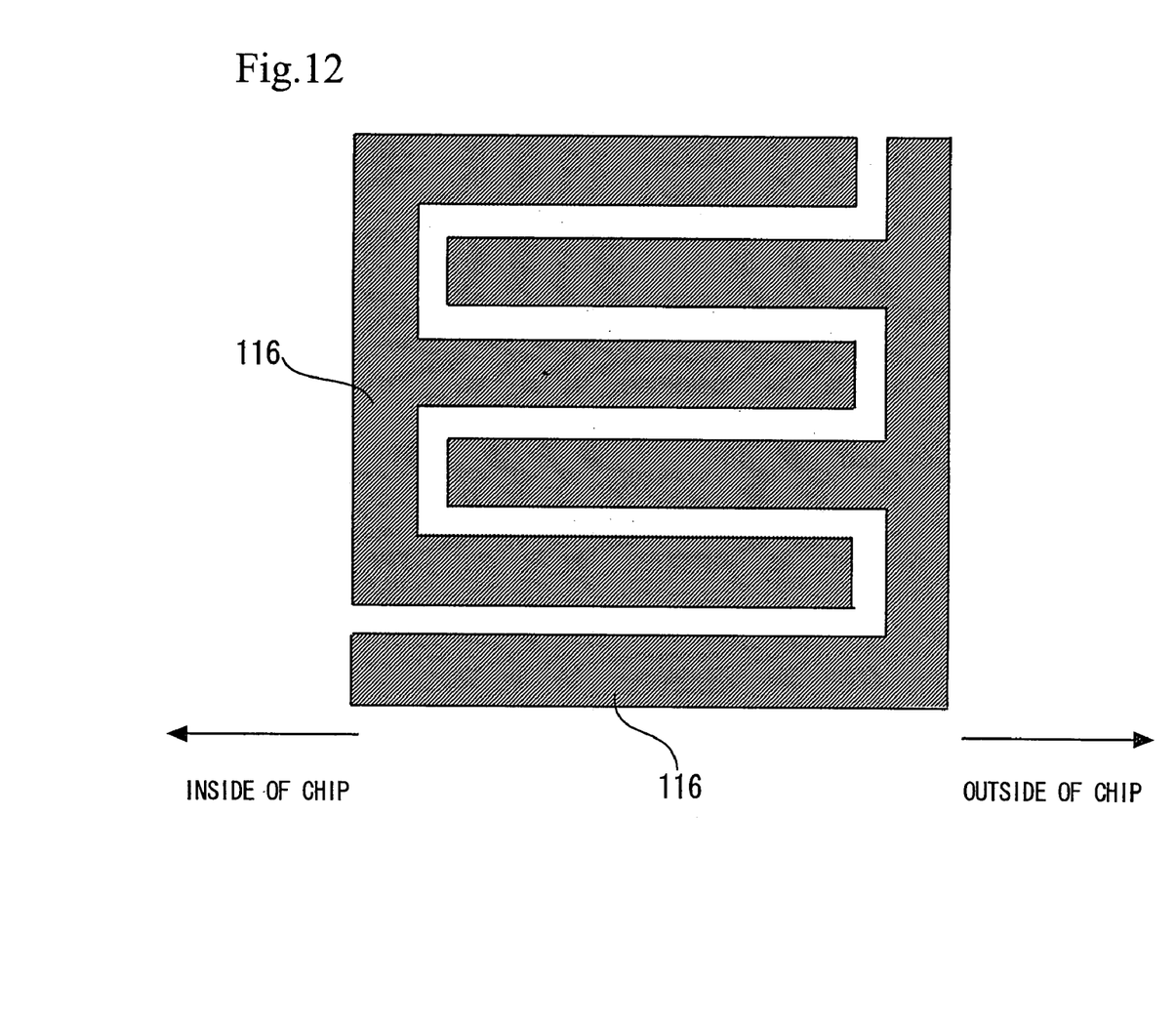
FIG. 12 is a plan view of the power supply wiring for the semiconductor device in FIG. 11.

FIG. 11 is a cross-sectional view for explaining a semiconductor device according to a third embodiment of the present invention, and FIG. 12 is a plan view of the power supply wiring for the semiconductor device in FIG. 11.

As shown in FIG. 12, power supply wiring 116 is formed like a comb. The comb-shaped power supply wiring 116 constitutes a metallic capacitor element. As shown in FIG. 11, the comb-shaped power supply wiring 116 is not connected to diffusion layers 117b and 118, or to a protective element such as an MIS transistor, all of which are located beneath first wiring 106. Plugs 120 are provided only in the portions of a silicon oxide film 102 beneath ground wiring 115, and the ground wiring 115 and a diffusion layer 117a are connected by the plugs 120. Since plugs are not formed in the portions of the silicon oxide film 102 beneath the power supply wiring 116, the silicon oxide film 102 cannot be replaced by a low-k dielectric film, unlike in the first and second embodiments.

According to the third embodiment, the power supply wiring 116, which constitutes a metallic capacitor element, is also employed as the structure for reinforcing the low-k dielectric film 103. Further, the ground wiring 115, which is connected through the plugs 120 to the diffusion layer 117a for the prevention of latch-up, is also employed as the structure for reinforcing the low-k dielectric film 103. Therefore, as in the first embodiment, the mechanical strength of the low-k dielectric film 103 located beneath the bonding pad 112 is increased, and the metallic capacitor element 116, which is a protective element in an I/O block, can be effectively utilized as wiring for reinforcing the low-k dielectric film 103. Therefore, the dimensions of the semiconductor chip can be reduced, and the manufacturing cost for the semiconductor device can also be reduced. Furthermore, since the semiconductor chip can be smaller, the size of an electrical communication device such as a portable communication device on which this chip is mounted can also be reduced.

Further, according to the third embodiment, since the wiring width/interval ratio for the power supply wiring 116 and the ground wiring 115 is set to two or greater, the yield of the wire fracture test results can be increased, and a semiconductor device having a superior bonding strength can be obtained.

This invention, when practiced illustratively in the manner described above, provides the following major effects:

According to the present invention, since mesh wiring is employed as a structure for reinforcing a low-k dielectric film, it is possible to provide a semiconductor device having both a high mechanical strength and a pad structure that permits the size of a semiconductor chip to be reduced.

Further, the present invention is not limited to these embodiments, but variations and modifications may be made without departing from the scope of the present invention.

The entire disclosure of Japanese Patent Application No. 2004-031877 filed on Feb. 9, 2004 containing specification, claims, drawings and summary are incorporated herein by reference in its entirety.

What is claimed is:

1. A semiconductor device comprising:
   a protective element, including a capacitor, located on a substrate;
   a low-k dielectric film located opposite the protective element and having mechanical strength smaller than a silicon oxide film;
   a mesh wiring located opposite the protective element and in the low-k dielectric film, the mesh wiring including power supply wirings and ground wirings arranged like a mesh, the mesh wiring being electrically connected to the protective element;
   a silicon oxide film on the mesh wiring and on the low-k dielectric film; and
   a bonding pad on the silicon oxide film and opposite the mesh wiring.

2. The semiconductor device according to claim 1, wherein the power supply wirings and the ground wirings have a wiring width at least twice a wiring interval of the mesh wiring.

3. The semiconductor device according to claim 1, wherein the mesh wiring reinforces the low-k dielectric film.

4. A semiconductor device comprising:
   a low-k dielectric film on a substrate and having mechanical strength smaller than a silicon oxide film;
   a mesh wiring in the low-k dielectric film and including power supply wirings and ground wirings arranged like a mesh, the power supply wirings including two mutually electrically insulated parts functioning as a capacitor;
   a silicon oxide film on the mesh wiring and the low-k dielectric film; and
   a bonding pad on the silicon oxide film.

5. A semiconductor device comprising:
   a protective element selected from the group consisting of a diode and a transistor, and located on a substrate;
   a low-k dielectric film located opposite the protective element and having mechanical strength smaller than a silicon oxide film;
   a mesh wiring located opposite the protective element and in the low-k dielectric film, the mesh wiring including power supply wirings and ground wirings arranged like a mesh, the mesh wiring being electrically connected to the protective element;
   a silicon oxide film on the mesh wiring and on the low-k dielectric film; and
   a bonding pad on the silicon oxide film and opposite the mesh wiring.

6. The semiconductor device according to claim 5, wherein the power supply wirings and the ground wirings have a wiring width at least twice a wiring interval of the mesh wiring.

7. The semiconductor device according to claim 5, wherein the mesh wiring reinforces the low-k dielectric film.

* * * * *